(12) United States Patent
Ryu

(10) Patent No.: US 7,556,504 B2
(45) Date of Patent: Jul. 7, 2009

(54) CAMERA MODULE AND CAMERA MODULE ASSEMBLY

(75) Inventor: Chung Sang Ryu, Ansan-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/753,630

(22) Filed: May 25, 2007

(65) Prior Publication Data

US 2007/0275596 A1    Nov. 29, 2007

(30) Foreign Application Priority Data

May 25, 2006    (KR) ...................... 10-2006-0047193

(51) Int. Cl.
*H01R 12/00* (2006.01)
(52) U.S. Cl. .......................................... 439/70; 439/71
(58) Field of Classification Search ................... 439/70, 439/71

See application file for complete search history.

(56) References Cited

U.S. PATENT DOCUMENTS

| | | | | |
|---|---|---|---|---|
| 6,905,344 | B2 * | 6/2005 | Nishio et al. ................... | 439/68 |
| 7,121,864 | B1 * | 10/2006 | Yang .......................... | 439/331 |
| 2004/0247311 | A1 * | 12/2004 | Ajiki et al. ................... | 396/535 |
| 2006/0098969 | A1 * | 5/2006 | Asai et al. ..................... | 396/89 |
| 2006/0189216 | A1 * | 8/2006 | Yang .......................... | 439/680 |

* cited by examiner

*Primary Examiner*—Briggitte R Hammond
*Assistant Examiner*—Vanessa Girardi
(74) *Attorney, Agent, or Firm*—Saliwanchik, Lloyd & Saliwanchik

(57) ABSTRACT

Disclosed are a camera module and a camera module assembly. The camera module can include a Printed Circuit Board (PCB) provided on an outer side thereof with contact terminals connected to a corresponding socket module, an image sensor mounted on the PCB, and a housing disposed on the PCB. The camera module assembly includes a camera module provided on a lower surface thereof with contact terminals, and a socket module in which the camera module is coupled.

13 Claims, 8 Drawing Sheets

CAMERA MODULE AND CAMERA MODULE ASSEMBLY

CROSS-REFERENCE TO RELATED APPLICATION

The present application claims the benefit under 35 U.S.C. § 119 to Korean Patent Application No. 10-2006-0047193, filed May 25, 2006.

BACKGROUND

Recently, portable electronic appliances have been fabricated in small sizes with multi-functions, such as communication, photographing and sound replay functions realized in a module unit, and the size of each module has been significantly miniaturized. Specifically, portable electronic appliances, such as cell phones and PDAs, are equipped with a small Compact Camera Module (CCM) to provide photographing functions and such portable electronic appliances have been extensively used.

The camera module includes an image sensor such as a Charge Coupled Device (CCD) or a Complementary Metal Oxide Semiconductor (CMOS) image sensor, and converts optical energy into electrical signals through the image sensor, thereby acquiring image data of a subject.

FIG. 1 is a perspective view of a camera module according to the related art. The camera module will be briefly described below.

Referring to FIG. 1, the camera module 10 includes a Printed Circuit Board (PCB) 12, a header connector 14, a housing 16 and a lens unit 18.

An image sensor (not shown) is connected to one end of the upper surface of the PCB 12 by wire, and the header connector 14 is mounted on the other end of the upper surface thereof through Surface Mount Technology (SMT). The header connector 14 is connected to the connector of a main PCB in a portable terminal so as to transmit various signals.

The housing 16 is coupled to one end of the upper surface of the PCB 12. The housing 16 seals the outer side of the image sensor (not shown). The lens unit 18 is coupled to the upper surface of the housing 16. The lens unit 18 includes a glass filter (not shown) and a lens 20, and can be screw-coupled to the housing 16.

In such a camera module 10, since the PCB 12 has an image sensor area and a header connector area, there is a limitation in reducing the size of the PCB 12. Therefore, reducing the size of the camera module 10 is difficult.

In addition, since the PCB 12 has a connector structure, work efficiency for the camera module 10 deteriorates.

BRIEF SUMMARY

An embodiment provides a camera module, in which a contact terminal is formed on the outer side of the camera module.

An embodiment provides a camera module that forms a contact terminal on the outer side of a PCB and can be coupled in a socket module, and a camera module assembly.

An embodiment provides a camera module comprising: a Printed Circuit Board (PCB) provided on an outer side thereof with contact terminals connected to a corresponding module; an image sensor mounted on the PCB; a housing disposed on the PCB; and a lens unit coupled in the housing.

An embodiment provides a camera module comprising: an image sensor; a housing for sealing an outer side of the image sensor; a lens unit coupled to an upper portion of the housing; and a Printed Circuit Board (PCB) having a size corresponding to a size of an under portion of the housing, in which the image sensor and the housing are arranged and contact terminals connected to a corresponding module are formed.

An embodiment provides a camera module assembly comprising: a camera module included a Printed Circuit Board (PCB) provided on an outer side thereof with contact terminals, an image sensor mounted on the PCB, a housing fixed to an upper part and an edge part of the PCB, and a lens unit coupled in the housing; a camera module provided on a lower surface thereof with contact terminals; and a socket module in which the camera module is coupled.

According to embodiments, a camera module can be connected by a self-contact point of a PCB without a connector, so that the work efficiency and productivity of the camera module can be improved.

DETAILED DESCRIPTION OF THE EMBODIMENTS

Figure 1:
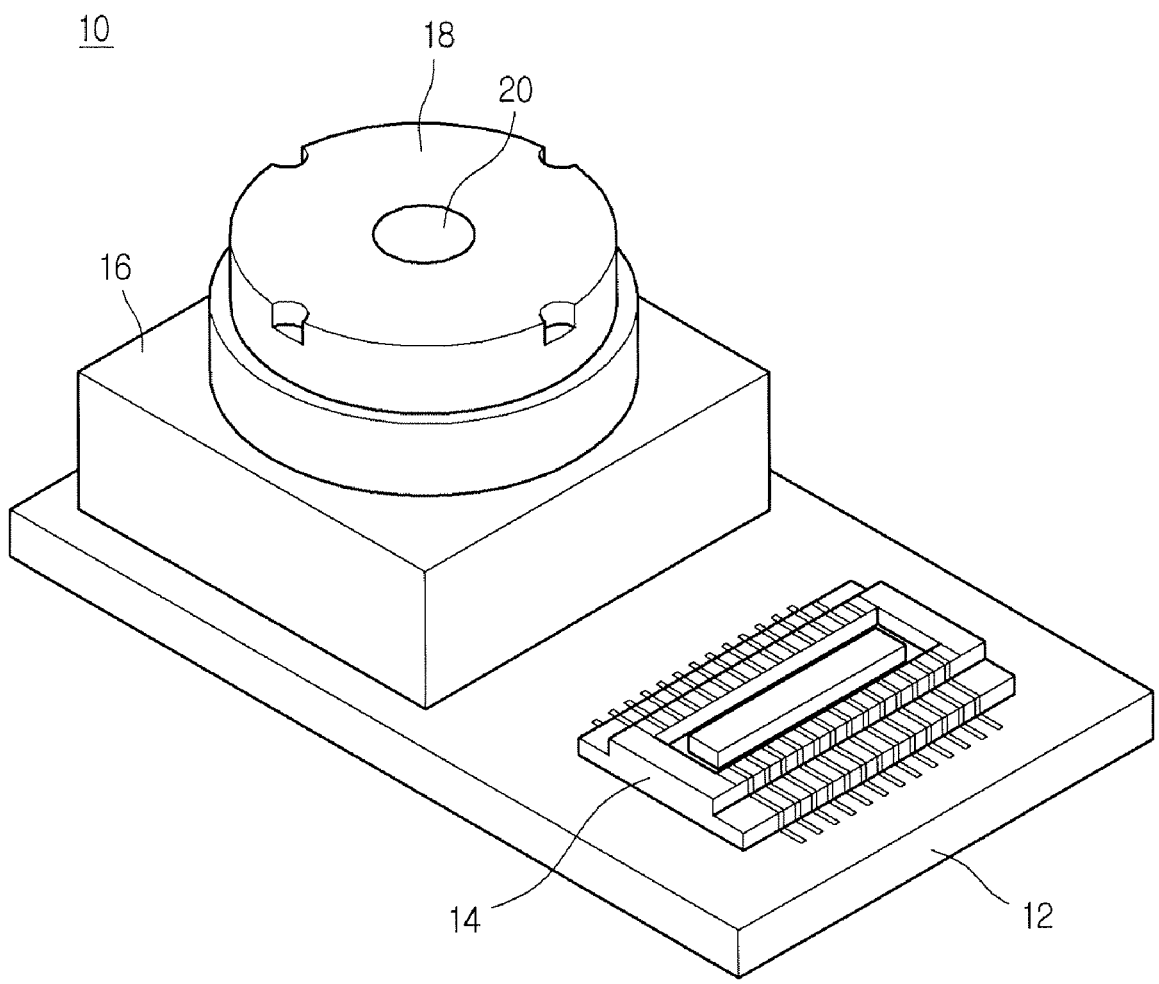
FIG. 1 is a perspective view of a camera module according to the related art.
Figure 2:
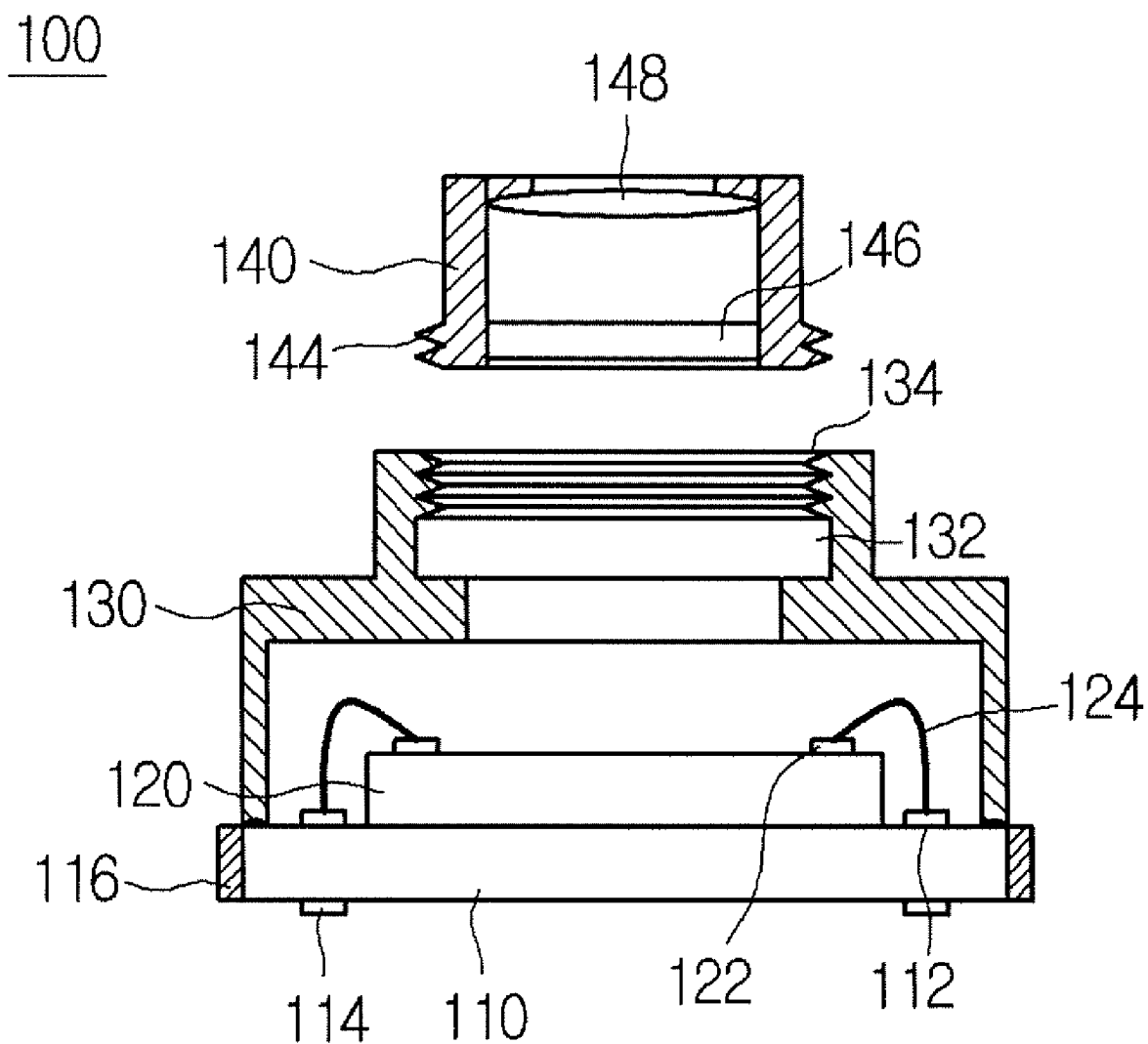
FIG. 2 is a cross-sectional view of a camera module according to an embodiment.
Figure 3:
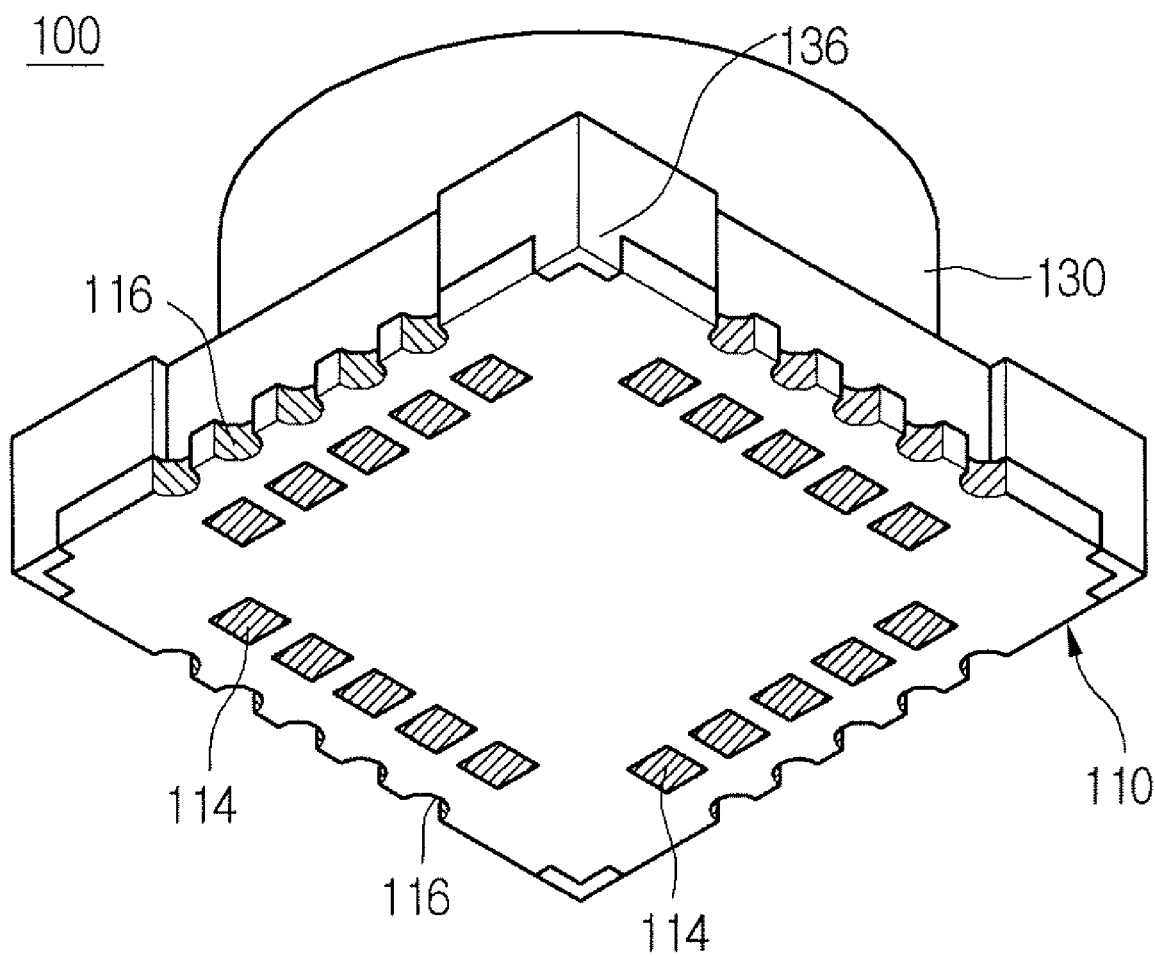
FIG. 3 is a perspective view of a camera module according to an embodiment.

FIG. 2 is a cross-sectional view of a camera module according to an embodiment, and FIG. 3 is a perspective view of a camera module according to an embodiment.

Referring to FIGS. 2 and 3, the camera module 100 includes a Printed Circuit Board (PCB) 110, an image sensor 120, a housing 130 and a lens unit 140.

The PCB 110 can be fabricated as a multi-layer PCB, and a plurality of device parts can be mounted thereon by a predetermined circuit pattern. A plurality of electrode terminals 112, and first and second contact terminals 114 and 116 are formed on the PCB 110 in such a manner that the first and second contact terminals 114 and 116 can be connected to a corresponding module. The electrode terminals 112 are formed on the top layer of the PCB 110, the first contact terminals 114 are formed on the bottom layer thereof, and the second contact terminals 116 are formed on the sidewall thereof.

The electrode terminals 112 and the first contact terminals 114 can include conductive pads obtained by plating a copper thin film with predetermined metal, i.e. gold and/or nickel.

The second contact terminals 116 can be formed on at least one sidewall of the PCB 110, this sidewall may have a concave-convex shape, in which vias or via holes corresponding to the second contact terminals 116 are formed in the concave section. In addition, the second contact terminals 116 of the PCB 110 can be formed on the left/right sidewall or the front/rear sidewall.

In the PCB 110, the first contact terminals 114 can be formed in various positions in the bottom layer.

The first and second contact terminals 114 and 116 are interconnected by an internal pattern, so that they can function as a terminal. The first and second contact terminals 114 and 116 can be connected to the electrode terminals 112 according to the structures of a circuit pattern.

An image sensor 120 is mounted on the PCB 110. The image sensor 120 can be realized, for example, as a CCD or a CMOS image sensor, and can be provided as a semiconductor chip of Ball Grid Array (BGA), Chip Scale (Size) Package (CSP) and Chip On Board (COB) types, but is not limited to these types.

The image sensor 120, for example, can be bonded to the top layer of the PCB 110 by using an adhesion member, i.e. epoxy, and the pads 122 of the image sensor 120 can be connected to the electrode terminals 112 of the PCB 110 by wire 124. The image sensor 120 can be mounted on the PCB 110 in a flip type.

A housing 130 is fixed to the outer side of the image sensor 120, and a lens unit 140 is coupled to the upper surface of the housing 130. For example, a housing thread 134 can be formed in the inner side 132 of the housing 130, and a lens unit thread 144 can be formed on the outer side of the lens unit 140, so that the lens unit 140 can be screw-coupled to the inner side 132 of the housing 130. The lens unit 140 may also be integrally formed with the housing 130.

The lens unit 140 can be embodied in the form of a barrel and can include a filter 146 and a lens 148. The filter 146 can be disposed between the image sensor 120 and the lens 148, and can include a glass filter or an IR filter. The lens 148 can include one or more lenses and condenses incident light to the image sensor 120.

The lens unit 140 provides the image sensor 120 with an optical path, and the image sensor 120 converts an image formed on a sensor device (not shown) through the lens unit 140 into electrical signals.

As shown in FIG. 3, at least one edge part 136 of the housing 130 is disposed at the edge part of the PCB 110. Thus, since the housing 130 is supported by the edge part of the PCB 110, the housing 130 can be prevented from being tilted. The PCB 110 can have a size corresponding to the size (or size of a sidewall) of the housing 130, and the housing 130 can have a stepped sidewall such that at least a portion of the sidewall of the PCB 110 is exposed out of the housing 130.

Figure 4:
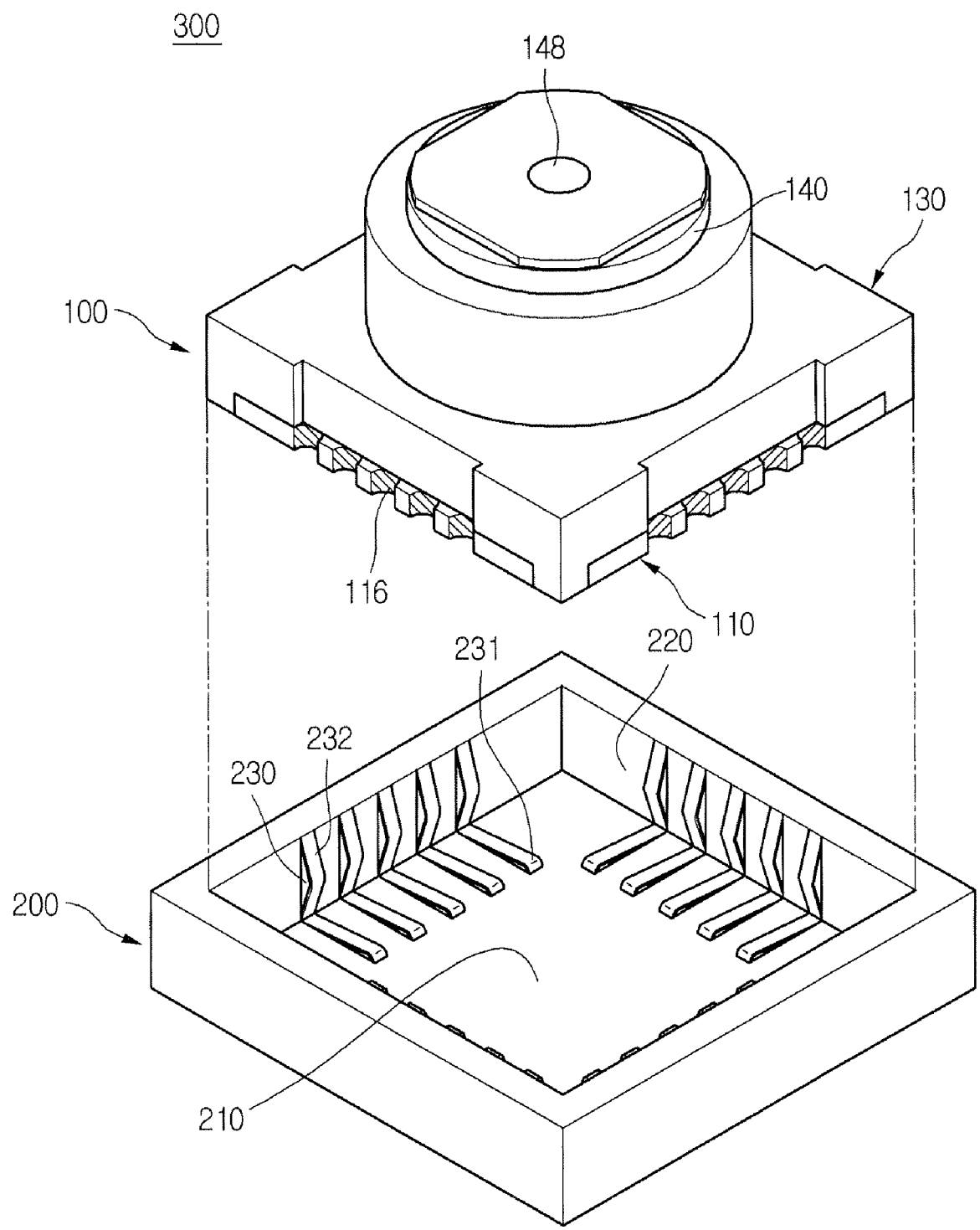
FIG. 4 is an exploded perspective view of a camera module assembly according to an embodiment.

The camera module 100 can use the first contact terminals 114 and/or the second contact terminals 116 formed on the outer side of the PCB 110 as connection terminals, and can be mounted on an apparatus such as a socket module 200 (as illustrated in FIG. 4). For example, as the camera module 100 is mounted on the socket module 200, the first and second contact terminals 114 and 116 make electrical contact with the socket module 200, so that the first and second contact terminals 114 and 116 can transfer various signals such as DATA, CLOCK, SCL, SDA and SYNC of the camera module 100.

FIG. 4 is an exploded perspective view of a camera module assembly according to an embodiment.

Referring to FIGS. 3 and 4, the camera module assembly 300 includes the camera module 100 and the socket module 200.

The camera module 100 can be coupled in the socket module 200. The socket module 200 includes a module receiving portion 210 and terminal contacting portion 230.

The module receiving portion 210 can have the same shape as the lower shape of the camera module 100, and the PCB 110 and the housing 130 can be partially inserted into the module receiving portion 210.

The terminal contacting portion 230 can include first terminal contact members 231 formed on the module receiving portion 210 and second terminal contact members 232 formed on an inner sidewall 220 of the socket module 200. The first terminal contact members 231 and the second terminal contact members 232 can be integrally formed with each other, or can be formed with an independent structure.

The first terminal contact members 231 can correspond to the first contact terminals (reference numeral 114 in FIG. 3) of the PCB 110, and the second terminal contact members 232 can correspond to the second contact terminals (reference numeral 116 in FIG. 3). The first and second contact terminals 114 and 116 of the PCB 110 make contact with the first and second terminal contact members 231 and 232 of the socket module 200, respectively, thereby improving the electrical reliability by a dual contact structure.

As the camera module 100 is coupled in the socket module 200, the second terminal contact members 232 of the socket module 200 provide elasticity to the concave section of the sidewall having the concave-convex shape of the PCB 110. Accordingly, the PCB 110 can be inhibited from moving upward by means of the second terminal contact members 232 of the socket module 200.

In the embodiment, the first and second contact terminals 114 and 116 of the PCB 110 can be formed in various areas or positions. Further, the shape or formation position of the terminal contacting portion 230 in the socket module 200 can change depending on the structure of the first and second contact terminals 114 and 116. The fixed structure of the camera module 100 and the socket module 200 may also be formed on the housing 130.

Figure 5:
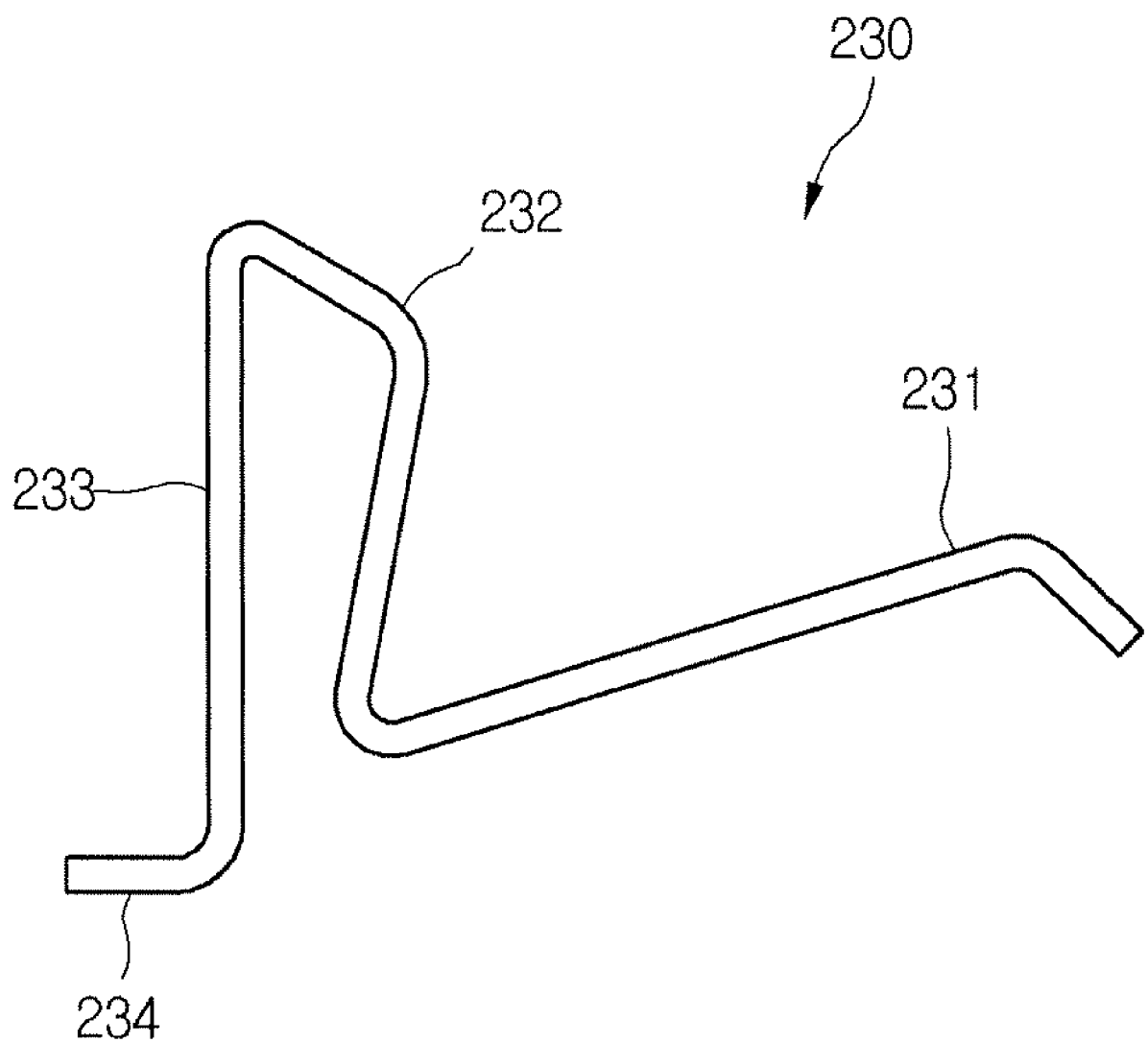
FIG. 5 is a perspective view illustrating a terminal contact of a socket module according to an embodiment.

FIG. 5 is a perspective view illustrating an embodiment of the terminal contact 230 of the socket module employed in FIG. 4.

Referring to FIGS. 4 and 5, each of the terminal contacting portion 230 can include the first terminal contact member 231, the second terminal contact members 232, a support member 233, and a socket terminal 234. The first terminal contact member 231 is horizontally bent to protrude into the module receiving portion 210 of the socket module 200. The second terminal contact member 232 is bent vertically with respect to the first terminal contact member 231, and is formed along the inner sidewall of the socket module 200. The support member 233 is bent perpendicularly to the second terminal contact member 232, and is supported to the inner sidewall of the socket module 200. The socket terminal 234 is connected to the support member 233 and can be exposed out of the socket module 200.

The first terminal contact member 231 provides elasticity in the up and down directions of the socket module 200, and the second terminal contact member 232 provides elasticity in the left and right directions of the socket module 200.

Figure 6:
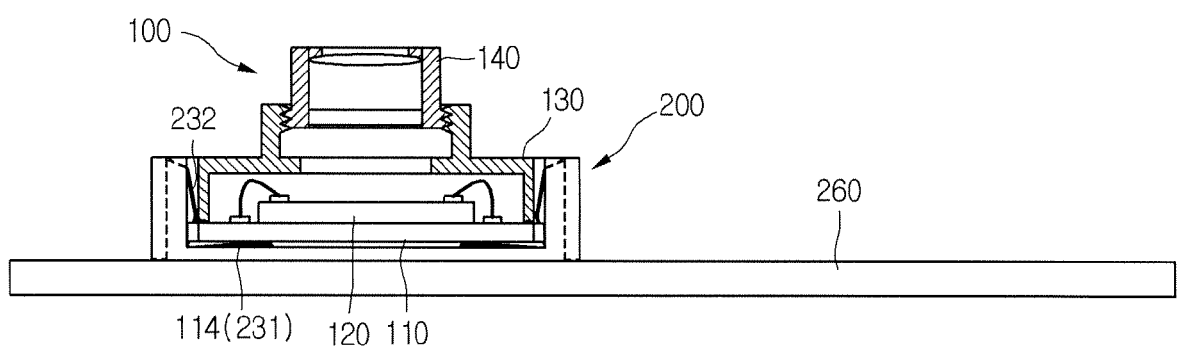
FIG. 6 is a cross-sectional view illustrating a camera module assembly according to an embodiment.

FIG. 6 is a cross-sectional view illustrating an example in which the camera module assembly is mounted according to an embodiment.

Referring to FIG. 6, the socket module 200 can be mounted on a main PCB 260 of a portable terminal through SMT, and the camera module 100 can be mounted on the socket module 200. The camera module 100 makes electrical contact with the socket module 200 by using the contact terminal with a dual structure formed on the lower surface of the camera module 100. The portable terminal can be, for example, a cell phone, a digital camera, a PDA, etc.

Multiple socket modules 200 can be mounted on the main PCB 260, and multiple camera modules 100 mounted on the socket modules 200 can include modules having the same number of pixels, or modules having a low-pixel level or a high-pixel level.

Since the camera module 100 can be mounted on or detached from the socket module 200, the camera module 100 can be easily replaced with another camera module.

Figure 7:
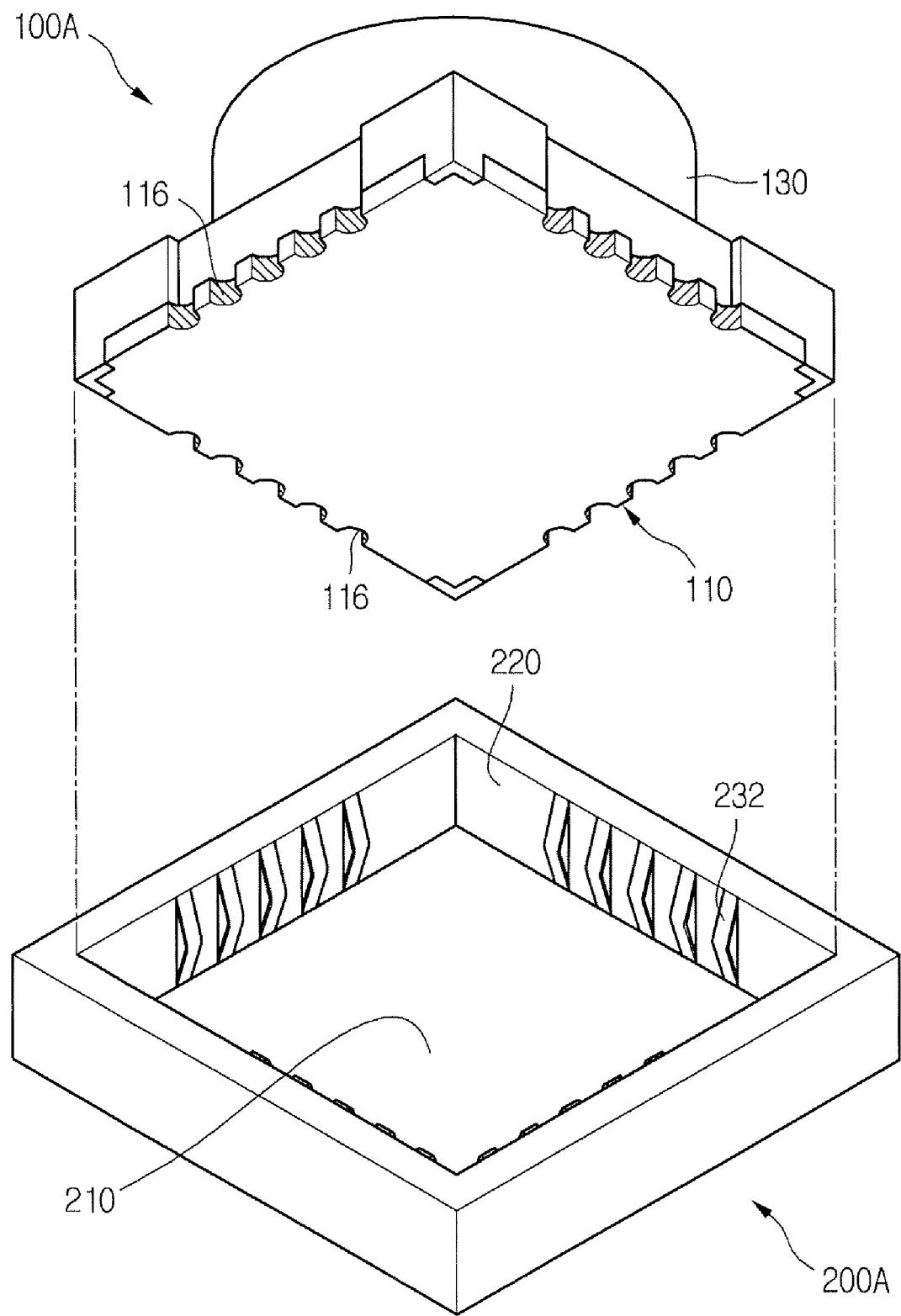
FIG. 7 is an exploded perspective view illustrating another example in which a camera module is mounted on a socket module in a camera module assembly according to an embodiment.

FIG. 7 is an exploded perspective view illustrating another example in which a camera module is mounted on a socket module in the camera module assembly according to an embodiment.

Referring to FIG. 7, the camera module 100A uses the second contact terminals 116 formed on the sidewall of the PCB 110 as connector terminals.

As the camera module 100A is mounted on the socket module 200A, the second contact terminals 116 of the camera module 100A make contact with the second terminal contact members 232 formed on the inner sidewall 220 of the socket module 200A, respectively. Further, the outer side of the camera module 100A is pressed by elasticity of the second terminal contact members 232 of the socket module 200A, so that the camera module 100A can be inhibited from moving upward.

Figure 8:
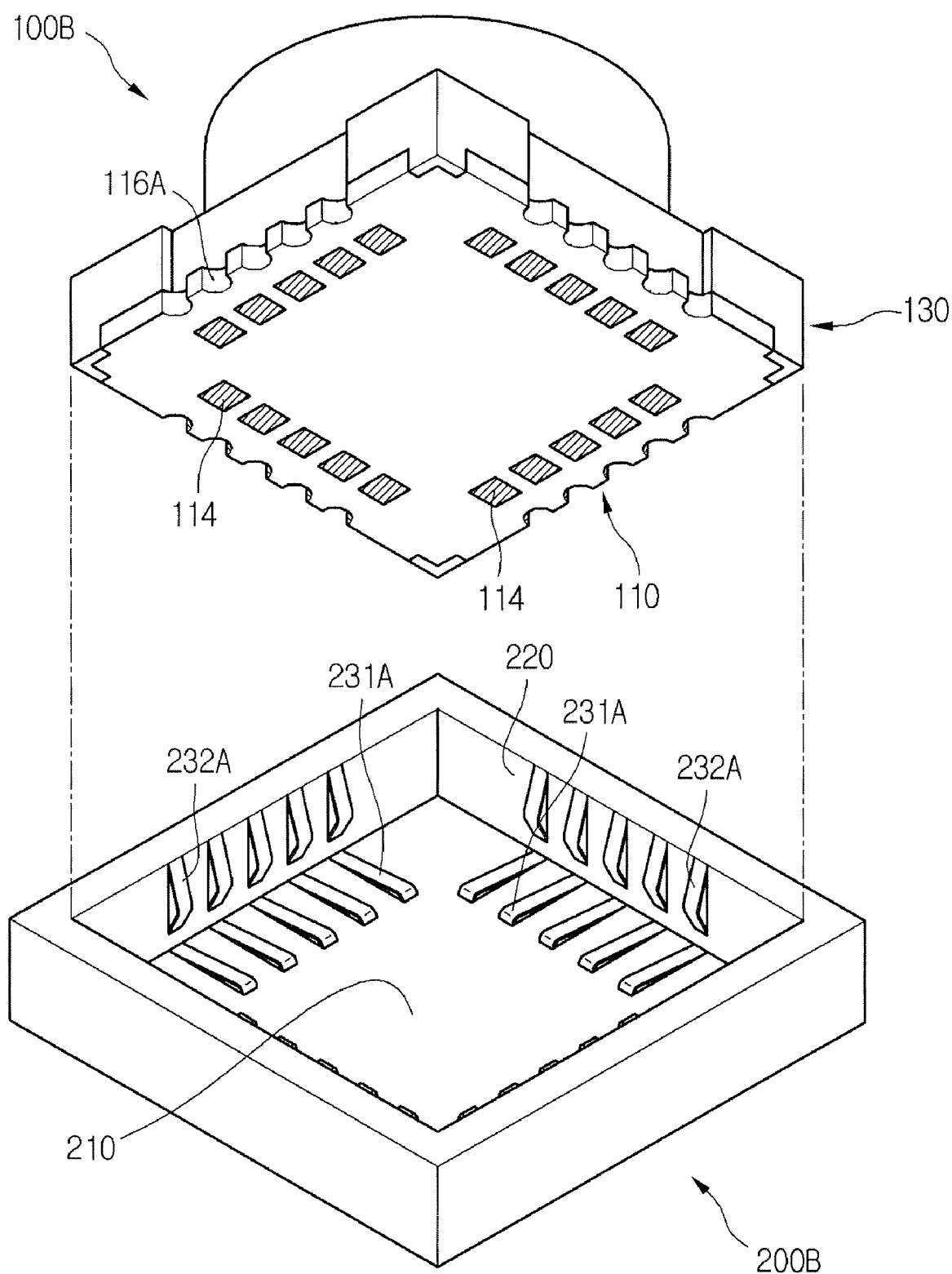
FIG. 8 is an exploded perspective view illustrating yet another example in which a camera module is coupled in a socket module in a camera module assembly according to an embodiment.

FIG. 8 is an exploded perspective view illustrating yet another example in which a camera module is mounted on a socket module in the camera module assembly according to an embodiment.

Referring to FIG. 8, the camera module 100B uses the first contact terminals 114 formed on the bottom layer of the PCB 110 as connector terminals. The sidewall of the PCB 110 has a simple concave-convex structure 116A for fixation.

As the camera module 100B is coupled in the socket module 200B, the first contact terminals 114 of the PCB 110 make contact with the first electrode contact members 231A of the socket module 200B, and the concave-convex structure 116A formed on the sidewall of the PCB 110 can be fixed in place by the contact members 232A formed on the inner sidewall 220 of the socket module 200B.

According to an embodiment as described above, the camera modules 100, 100A and 100B use the self-contact point of the PCB 110 as a connector terminal, so that the size of the camera module and the camera module assembly can be minimized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A camera module comprising:
   a Printed Circuit Board (PCB) comprising:
      a plurality of first contact terminals provided on an outer side of the PCB for contact with a corresponding module; and
      a plurality of second contact terminals provided on a bottom surface of the PCB for contact with the corresponding module;
   an image sensor mounted on the PCB;
   a housing disposed on the PCB; and
   a lens unit coupled in the housing,
   wherein the plurality of first contact terminals are interconnected with the plurality of second contact terminals.

2. The camera module according to claim 1, wherein the PCB comprises a multi-layer PCB having a size corresponding to the size of the housing.

3. The camera module according to claim 1, wherein the plurality of first contact terminal of the PCB comprises a via or a via hole formed on at least one sidewall of the PCB.

4. The camera module according to claim 1, wherein the corresponding module is a socket module which is coupled to the outer side of the PCB and the housing.

5. The camera module according to claim 4, wherein the socket module comprises a terminal contacting portion corresponding to the plurality of first contact terminals and the plurality of second contact terminals.

6. The camera module according to claim 5, wherein the socket module comprises a contact member formed to an inner side of the socket module to inhibit the PCB from being separated from the socket module in an upward direction.

7. A camera module comprising:
   an image sensor;
   a housing for sealing an outer side of the image sensor;
   a lens unit coupled to an upper portion of the housing; and
   a Printed Circuit Board (PCB) having a size corresponding to a size of an under portion of the housing,
   wherein the image sensor and the housing are arranged upon the PCB;
   wherein the PCB comprises a plurality of first contact terminals provided on at least one sidewall and a plurality of second contact terminals provided on a bottom layer of the PCB, for connecting to a corresponding module; and
   wherein the plurality of first convict terminals are interconnected with the plurality of second contact terminals.

8. The camera module according to claim 7, wherein a lower edge part of the housing is disposed at an edge part of the PCB.

9. A camera module assembly comprising:
   a camera module comprising a Printed Circuit Board (PCB), an image sensor mounted on the PCB, a housing fixed to an upper part and an edge part of the PCB, and a lens unit coupled in the housing; and
   a socket module in which the camera module is coupled;
   wherein the PCB comprises a plurality of first contact terminals provided on an outer side of the PCB, and a plurality of second contact terminals provided on a bottom layer of the PCB;
   wherein the socket module comprises a terminal contacting portion connected to the plurality of first contact terminals and the plurality of second contact terminals;
   wherein the plurality of first contact terminals of the PCB comprises a via hole formed in at least one sidewall of PCB, and wherein the plurality of second contact terminals comprises conductive pads on a bottom layer of the PCB; and wherein the plurality of first contact terminals and the plurality of second contact terminals are interconnected.

10. The camera module assembly according to claim 9, wherein the terminal contacting portion of the socket module comprises:
   a first terminal contact member formed into a module receiving portion of the socket module to contact a contact terminal of the plurality of first contact terminals;
   a second terminal contact member vertically formed to the first terminal contact member and formed along an inner sidewall of the socket module, to contact a contact terminal of the plurality of second contact terminals;
   a support member perpendicularly formed to the second terminal contact member and supported to the inner sidewall of the socket module;
   and a socket terminal connected to the support member and exposed out of the socket module.

11. The camera module assembly according to claim 9, further comprising a main PCB on which at least one socket module is mounted through Surface Mount Technology (SMT).

12. The camera module assembly according to claim 9, wherein the lens unit comprises at least one lens and at least one filter.

13. The camera module assembly according to claim 9, wherein the PCB has a size equal to a sidewall size of the housing.

* * * * *